(12) United States Patent
Chen

(10) Patent No.: US 12,250,797 B2
(45) Date of Patent: Mar. 11, 2025

(54) DISPLAY PANEL AND DISPLAY DEVICE

(71) Applicant: Wuhan China Star Optoelectronics Semiconductor Display Technology Co., Ltd., Wuhan (CN)

(72) Inventor: Huipeng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/777,039

(22) PCT Filed: Mar. 21, 2022

(86) PCT No.: PCT/CN2022/081918
§ 371 (c)(1),
(2) Date: May 15, 2022

(87) PCT Pub. No.: WO2023/151154
PCT Pub. Date: Aug. 17, 2023

(65) Prior Publication Data
US 2024/0389284 A1    Nov. 21, 2024

(30) Foreign Application Priority Data
Feb. 8, 2022 (CN) .......................... 202210118200.1

(51) Int. Cl.
*H05K 5/03* (2006.01)
*H05K 7/20* (2006.01)

(52) U.S. Cl.
CPC .......... *H05K 7/20963* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 9,425,434 B2* | 8/2016 | Lee | ............... | H10K 59/8792 |
| 9,627,647 B2* | 4/2017 | Kim | ............... | H10K 59/8731 |
| 9,711,583 B2* | 7/2017 | Choo | ............... | H01L 27/1225 |
| 10,198,974 B2* | 2/2019 | Yun | ............... | H10K 59/131 |
| 10,476,013 B2* | 11/2019 | Shin | ............... | H10K 59/8722 |
| 10,545,601 B2* | 1/2020 | Gao | ............... | G06F 1/1681 |
| 10,658,616 B2* | 5/2020 | Lee | ............... | H10K 50/8445 |
| 11,037,471 B2* | 6/2021 | Choi | ............... | H04M 1/0268 |

(Continued)

FOREIGN PATENT DOCUMENTS

| | | |
|---|---|---|
| CN | 106384730 A | 2/2017 |
| CN | 106992262 A | 7/2017 |

(Continued)

*Primary Examiner* — Xanthia C Relford
(74) *Attorney, Agent, or Firm* — Menachem Nathan; Nathan & Associates

(57) ABSTRACT

Embodiments of the present application provide a display panel and a display device, the display panel includes a flexible screen, an adhesive layer, a first heat dissipation layer, a support layer, and a second heat dissipation layer. Both the first heat dissipation layer and the second heat dissipation layer are disposed as metal heat dissipation layers. By arranging the heat dissipation layers as metal heat dissipation materials, heat formed during operation of the display panel can be quickly transferred and dissipated, thereby effectively improving performance of the display panel.

20 Claims, 4 Drawing Sheets

(56) References Cited

U.S. PATENT DOCUMENTS

| | | | | |
|---|---|---|---|---|
| 11,119,539 | B2* | 9/2021 | Lee | H05K 1/189 |
| 2013/0299790 | A1* | 11/2013 | Kang | H10K 71/00 |
| | | | | 438/34 |
| 2013/0306939 | A1* | 11/2013 | Park | H01L 27/1259 |
| | | | | 438/34 |
| 2014/0226275 | A1* | 8/2014 | Ko | G06F 1/1601 |
| | | | | 361/679.27 |
| 2015/0115229 | A1 | 4/2015 | Jung | |
| 2017/0181271 | A1* | 6/2017 | Yee | H05K 1/0271 |
| 2019/0312232 | A1* | 10/2019 | Yamazaki | H10K 59/874 |
| 2021/0255665 | A1* | 8/2021 | Yoo | H04M 1/0216 |
| 2021/0368658 | A1* | 11/2021 | Tang | G06F 1/1626 |
| 2021/0384457 | A1* | 12/2021 | Jang | H10K 71/00 |
| 2022/0071026 | A1* | 3/2022 | Ha | H10K 59/87 |

FOREIGN PATENT DOCUMENTS

| | | |
|---|---|---|
| CN | 209993275 U | 1/2020 |
| CN | 111312794 A | 6/2020 |
| CN | 111682000 A | 9/2020 |
| CN | 112289185 A | 1/2021 |
| CN | 113658517 A | 11/2021 |
| KR | 20210086337 A | 7/2021 |

\* cited by examiner

DISPLAY PANEL AND DISPLAY DEVICE

TECHNICAL FIELD

The present application relates to the technical field of manufacture of a display panel, and in particular, to a display panel and a display device.

BACKGROUND

With development of display technology such as manufacture process of a display panel, people put forward higher requirements for performance and quality of a display panel and a display device.

Organic light-emitting diode (OLED) display devices are used in many fields due to advantages of light weight, wide viewing angles, and high luminous efficiency compared to conventional liquid crystal displays (LCDs). An organic light-emitting diode display device comprises an array substrate and a plurality of other functional film layers. At present, when manufacturing a flexible OLED display device, a module stack structure is usually used for design, so as to reduce a thickness or size of a panel. However, since a display panel has a relatively small size, and when the display panel is working normally, each circuit layer or working module inside the panel will generate more heat. If the heat cannot be discharged or reduced in time, temperature inside the display panel will increase continuously, thus causing display problems in the display panel, such as short circuit inside the panel or even burnout of a weak film layer, and as a result, the display panel cannot work normally, which affects normal display of the display panel.

Therefore, it is necessary to propose a solution to the problems in the prior art.

Technical Problem

In conclusion, the film layers inside the display panel manufactured and formed in the prior art are stacked thickly, and when the display panel works for a long time, heat inside a device cannot be effectively dissipated, thereby causing display problems in the display panel.

Technical Solution

In order to solve above problems, an embodiment of the present application provides a display panel and a display device, so as to effectively improve a problem that heat generated by an internal device of the display panel during operation cannot be effectively transmitted to outside of the panel or dissipated, thereby causing display problems of the display panel.

In order to solve the above problems, technical methods provided in embodiments of the present application are as follows:

In a first aspect of embodiments of the present application, a display panel is provided, which comprises:
 a flexible screen comprising a straight section, a bending section and a bonding section that are sequentially connected;
 an adhesive layer disposed on a backlight side of the flexible screen, and the adhesive layer is correspondingly disposed in the straight section of the flexible screen;
 a first heat dissipation layer disposed on one side of the adhesive layer away from the flexible screen;
 a support layer disposed on one side of the first heat dissipation layer away from the adhesive layer; and
 a second heat dissipation layer, wherein one side of the second heat dissipation layer is bonded to the support layer, and another side of the second heat dissipation layer is electrically connected to a back side of the flexible screen corresponding to the bonding section;
 wherein the support layer and the second heat dissipation layer are disposed on one side close to the bending section, both the first heat dissipation layer and the second heat dissipation layer are disposed as metal heat dissipation layers, metal particles are disposed in the metal heat dissipation layers, and a gap is formed between adjacent metal particles.

According to an embodiment of the present application, materials of the first heat dissipation layer and the second heat dissipation layer comprise any one of copper, copper foil, silver, aluminum or an alloy thereof.

According to an embodiment of the present application, a heat dissipation property corresponding to a material of the first heat dissipation layer is greater than a heat dissipation property corresponding to a material of the second heat dissipation layer.

According to an embodiment of the present application, a material of the support layer comprises a metal material or a composite conductive material.

According to an embodiment of the present application, the composite conductive material comprises any one of a composite of a polymer and a graphite, a graphene composite, and a carbon nanocomposite.

According to an embodiment of the present application, the first heat dissipation layer, the support layer, and the second heat dissipation layer are flush with each other on one side close to the bending section.

According to a second aspect of embodiments of the present application, a display device is further provided, which comprises:
 a display panel;
 a function layer disposed on the display panel; and
 a cover plate disposed on the functional layer;
 wherein the display panel comprises a flexible screen comprising a straight section, a bending section and a bonding section that are sequentially connected.

According to a second aspect of embodiments of the present application, a display panel is provided, which comprises:
 a flexible screen comprising a straight section, a bending section and a bonding section that are sequentially connected;
 an adhesive layer disposed on a backlight side of the flexible screen, and the adhesive layer is correspondingly disposed in the straight section of the flexible screen;
 a first heat dissipation layer disposed on one side of the adhesive layer away from the flexible screen;
 a support layer disposed on one side of the first heat dissipation layer away from the adhesive layer; and
 a second heat dissipation layer, wherein one side of the second heat dissipation layer is bonded to the support layer, and another side of the second heat dissipation layer is electrically connected to a back side of the flexible screen corresponding to the bonding section;
 wherein the support layer and the second heat dissipation layer are disposed on one side close to the bending section, and both the first heat dissipation layer and the second heat dissipation layer are disposed as metal heat dissipation layers.

According to an embodiment of the present application, materials of the first heat dissipation layer and the second heat dissipation layer comprise any one of copper, copper foil, silver, aluminum or an alloy thereof.

According to an embodiment of the present application, a heat dissipation property corresponding to a material of the first heat dissipation layer is greater than a heat dissipation property corresponding to a material of the second heat dissipation layer.

According to an embodiment of the present application, a material of the support layer comprises a metal material or a composite conductive material.

According to an embodiment of the present application, the composite conductive material comprises any one of a composite of a polymer and a graphite, a graphene composite, and a carbon nanocomposite.

According to an embodiment of the present application, the first heat dissipation layer, the support layer, and the second heat dissipation layer are flush with each other on one side close to the bending section.

According to an embodiment of the present application, a projected area of the first heat dissipation layer on the adhesive layer is larger than projected areas of the support layer and the second heat dissipation layer on the adhesive layer.

According to an embodiment of the present application, an auxiliary support column is further disposed in the receiving chamber, and a height of the auxiliary support column is not greater than that of the receiving chamber.

According to an embodiment of the present application, the first heat dissipation layer and the second heat dissipation layer have a thickness of 30 um to 150 um.

According to an embodiment of the present application, the support layer comprises at least two sub-support layers disposed at intervals, and a receiving chamber is provided between two adjacent sub-support layers.

According to an embodiment of the present application, the display panel further comprises foam, a driver chip and a flexible circuit board, the foam is disposed on one side of the first heat dissipation layer away from the flexible screen, the driver chip and the flexible circuit board are disposed on the flexible screen, and are electrically connected to the bonding section of the flexible screen.

According to an embodiment of the present application, the display panel further comprises a flexible protective layer, and the flexible protective layer is disposed on a corresponding flexible screen in the bending section.

According to a third aspect of embodiments of the present application, a display device is further provided, which comprises:
  a display panel;
  a function layer disposed on the display panel; and
  a cover plate disposed on the functional layer
  wherein the display panel is the display panel provided in the embodiments of the present application.

Technical Effects

In conclusion, embodiments of the present application have the following beneficial effects:

Embodiments of the present application provide a display panel and a display device, the display panel comprises a flexible screen, an adhesive layer, a first heat dissipation layer, a support layer and a second heat dissipation layer. The flexible screen comprises a straight section, a bending section and a bonding section. The bonding section is bound on the second heat dissipation layer, the support layer and the second heat dissipation layer are disposed on one side close to the bending section, and both the first heat dissipation layer and the second heat dissipation layer are disposed as metal heat dissipation layers. In embodiments of the present application, by arranging the first heat dissipation layer and the second heat dissipation layer as metal heat dissipation materials, and arranging the support layer as a material with good heat dissipation performance, heat formed in the display panel during operation can be rapidly dissipated, thus effectively improving the reliability of the display panel and the comprehensive performance of the panel.

DETAILED DESCRIPTION

The following description of each embodiment with reference to the appended drawings to illustrate specific embodiments in which the present disclosure can be implemented.

High-performance display panel manufactured and formed in the prior art is gradually developing towards a direction of lightness, thinness, and miniaturization. Due to a reduced size, integration of a display panel becomes higher, and an internal reserved space for heat dissipation is reduced. When the display panel works normally, especially when it works for a long time, a large amount of heat will be generated. If the heat cannot be removed from the panel in time, it will easily cause overheating of an internal device, which will result in degradation of the panel performance.

Figure 1:
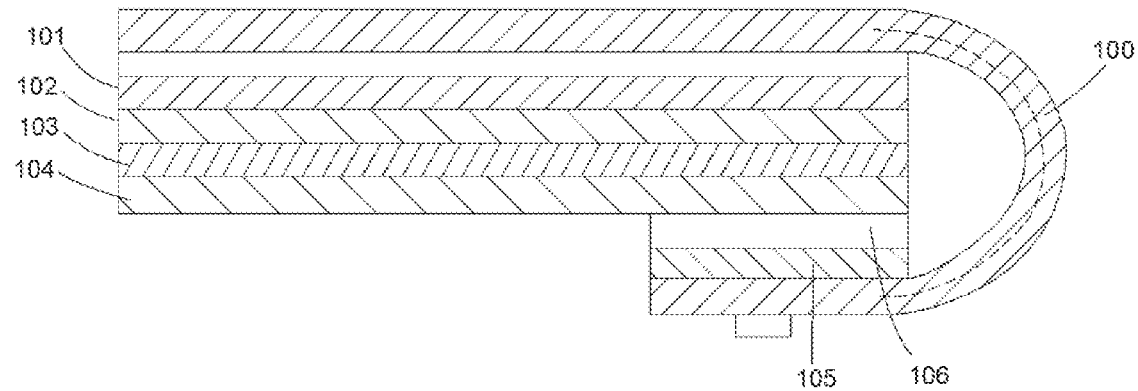
FIG. 1 is a schematic structural diagram of a film layer of a display panel provided in the prior art.

As shown in FIG. 1, FIG. 1 is a schematic structural diagram of a film layer of a display panel provided in the prior art. In a process of manufacturing and forming the display panel, it is necessary to bond a panel to finally obtain a panel with a required structure. Specifically, a display panel comprises a flexible screen 100, one end of the flexible screen is bent and bound to a back side of the display panel. Meanwhile, a backplate 101, a first foam layer 102, a second foam layer 103, a first heat dissipation layer 104, a support layer 106, and a second heat dissipation layer 105 are sequentially disposed on a back side of the flexible screen 100. Wherein, the support layer 106 and the second heat dissipation layer 105 are correspondingly disposed in a bonding area of the panel.

In the prior art, a material of the support layer is generally an organic film layer material, and heat dissipation purpose of the panel is achieved by arranging a module stacking structure of the first foam layer 102 and the second foam layer 103, and a module stacking structure of the support layer 106 and the second heat dissipation layer 105. However, foam materials and organic materials cannot effectively discharge heat in the panel, resulting in accumulation of heat inside the panel, thus affecting performance of the panel.

An embodiment of the present application provides a display panel, so as to improve a film layer structure of the display panel, to effectively improve heat dissipation inside the display panel, and to improve comprehensive performance of the panel.

Figure 2:
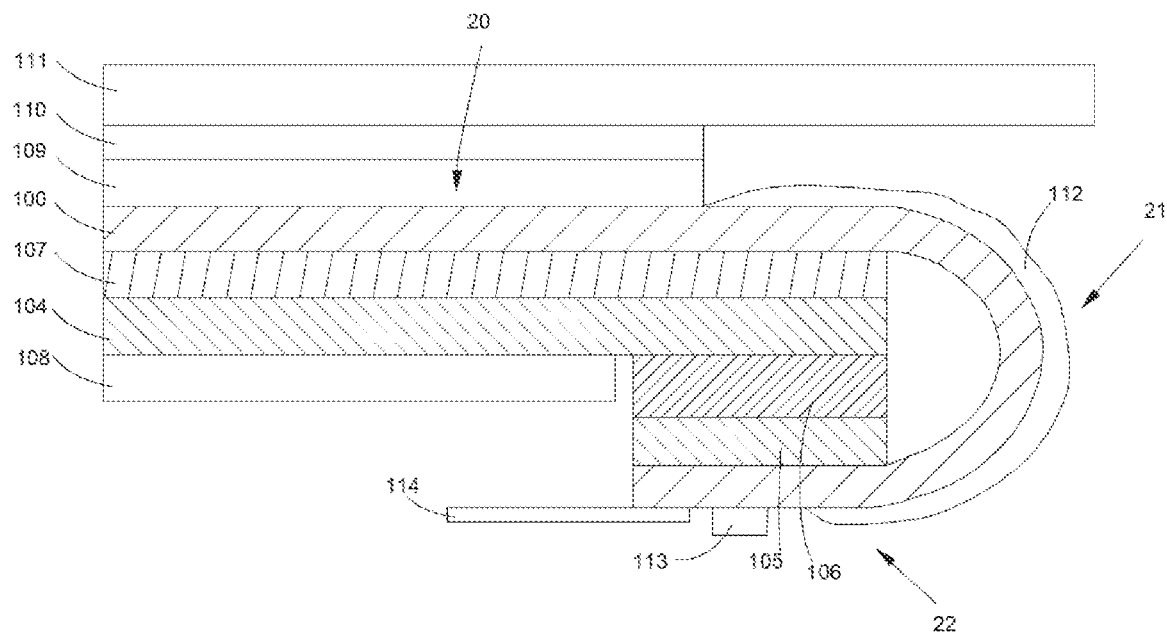
FIG. 2 is a schematic structural diagram of a film layer of a display panel according to an embodiment of the present application.

As shown in FIG. 2, FIG. 2 is a schematic structural diagram of a film layer of a display panel according to an embodiment of the present application. The display panel provided in embodiments of the present application is described here by taking a flexible display panel as an example. Specifically, the display panel comprises a flexible screen 100. In embodiments of the present application, the flexible screen 100 may be bent or folded, so as to achieve bending performance of the display panel. The flexible screen 100 comprises a straight section 20, a bending section 21, and a bonding section 22. The straight section 20 is connected to one end of the bending section 21, and another end of the bent section 21 is connected to the bonding section 22. The straight section 20 mainly plays a display function of the panel, the bending section 21 is bent, and the bonding section 22 of the flexible screen 100 is bound to a back side of the panel, thereby realizing a bonding process of the display panel.

Further, the display panel further comprises an adhesive layer 107, wherein the adhesive layer 107 is disposed on a backlight side of the flexible screen 100. The adhesive layer 107 is mainly disposed in a film layer area corresponding to the straight section 20 of the flexible screen in order to effectively bond the flexible screen 100.

In embodiments of the present application, the adhesive layer 107 may be an adhesive material such as a pressure-sensitive adhesive, an adhesive, an acrylic adhesive, a polyacrylic acid adhesive, and a polyester adhesive. The adhesive layer 107 still has a good adhesive performance at a higher temperature, so as to ensure stability of the performance of the display panel under long-time working conditions.

Furthermore, the display panel further comprises a first heat dissipation layer 104. The first heat dissipation layer 104 is disposed on one side of the adhesive layer 107 away from the flexible screen 100. In embodiments of the present application, the flexible screen 100 is directly bonded to the first heat dissipation layer 104 through the adhesive layer 107, and the adhesive layer 107 is usually a thin layer. When the flexible screen 100 is in operation, heat generated by the flexible screen 100 is directly transferred to the first heat dissipation layer 104, thereby effectively regulating and controlling a temperature of the flexible screen 100.

In embodiments of the present application, the display panel further comprises a support layer 106. Specifically, the support layer 106 is bonded to the first heat dissipation layer 104, that is, the support layer 106 is disposed on one side of the first heat dissipation layer 104 away from the adhesive layer 107.

Specifically, the support layer 106 is disposed on one side of the first heat dissipation layer 104. Preferably, the support layer 106 is disposed on one side of the flexible screen 100 close to the bending section 21. The support layer 106 mainly plays a supporting function. Therefore, a layout space of each device can be effectively saved by arranging the support layer 106 on one side of the film layer, thereby further improving the heat dissipation effect of the panel.

The display panel in embodiments of the present application further comprises a second heat dissipation layer 105. Specifically, the second heat dissipation layer 105 is disposed on one side of the support layer 106 away from the first heat dissipation layer 104. One side of the second heat dissipation layer 105 is bonded to the support layer 106, and another opposite side of the second heat dissipation layer 105 is bonded to the second heat dissipation layer 105, thereby forming a module stacking structure.

Preferably, in order to improve the heat dissipation performance of the stack module in the display panel, both the first heat dissipation layer 104 and the second heat dissipation layer 105 provided in embodiments of the present application are disposed as metal heat dissipation layers. Since the metal heat dissipation layer corresponding to metal materials has a high heat conductivity, the heat dissipation layer can effectively discharge heat generated by the panel, so as to ensure stability of the display panel under long-time working conditions.

In embodiments of the present application, materials of the first heat dissipation layer 104 and the second heat dissipation layer 105 may be selected from any one of copper, copper foil, silver, aluminum alloy, or an alloy thereof. When materials of the heat dissipation layers are selected as alloy materials, the alloy materials can be copper alloy, aluminum alloy, and other alloys with good heat conduction and heat transfer performance.

Further, in embodiments of the present application, when the metal heat dissipation layer is disposed, dispersed spherical metal particles can also be disposed in the metal heat dissipation layer, so that a certain gap may be formed between adjacent spherical metal particles to further enhance a heat dissipation effect of the heat dissipation layer.

Meanwhile, in embodiments of the present application, the first heat dissipation layer 104 is directly bonded to the adhesive layer 107. In order to improve heat dissipation performance of the first heat dissipation layer 104 to the flexible screen 100, the first heat dissipation layer 104 is disposed on a film layer corresponding to the entire straight section 20, thereby increasing a relative area between the two film layers and improving the heat dissipation performance.

Preferably, a projected area of the first heat dissipation layer 104 on the flexible screen 100 is larger than projected areas of the support layer 106 and the second heat dissipation layer 105 on the flexible screen 100. In embodiments of the present application, the support layer 106 and the second heat dissipation layer 105 are disposed on one side of the display panel, and sides of the first heat dissipation layer 104, the support layer 106 and, the second heat dissipation layer 105 are disposed flush with each other on this side. In this way, influence of a protruding film layer structure on a bending area corresponding to the bending section 21 can be avoided, thereby improving reliability of the display panel.

In embodiments of the present application, two opposite sides of the support layer 106 are respectively bonded to the first heat dissipation layer 104 and the second heat dissipation layer 105. Therefore, the support layer 106 can dissipate heat transferred in the heat dissipation layer on one hand, and can support two different heat dissipation layers on another hand. Therefore, in embodiments of the present application, a length of the support layer 106 may be less than a length of the first heat dissipation layer 104 or less than a length of the second heat dissipation layer 105.

Further, a material of the support layer 106 provided in embodiments of the present application may comprise a metal material or a composite conductive material. When it is a metal material, it can be selected from a material with good thermal conductivity such as copper alloy, iron alloy, and aluminum alloy. When a film layer material of the support layer 106 is a composite conductive material, the composite conductive material may be selected from any one of a composite material with conductive properties such as a polymer material, a graphite composite material, a graphene conformity material, and a carbon nanocomposite material.

Figure 3:
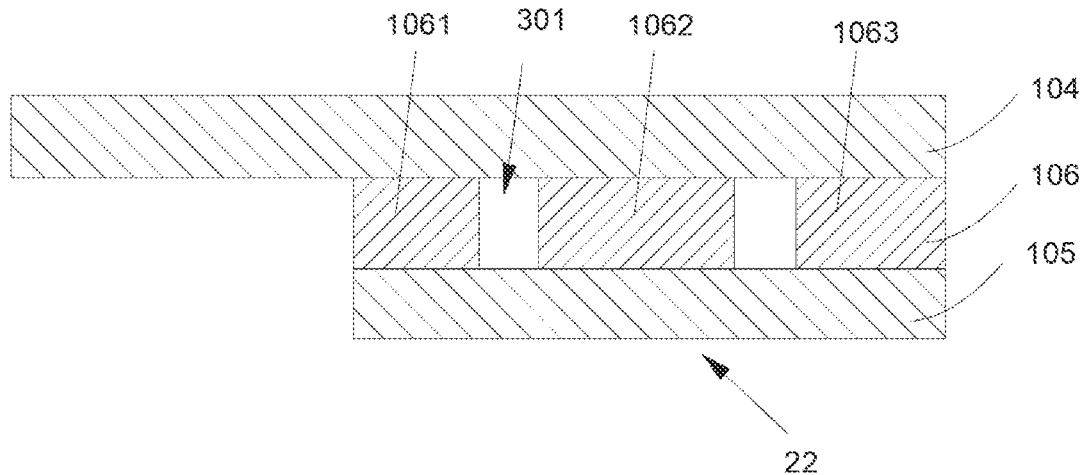
FIG. 3 is a schematic diagram of a heat dissipation laminated structure film layer according to an embodiment of the present application.

Preferably, in embodiments of the present application, the material of the support layer 106 is described by taking graphite as an example. As shown in FIG. 3, FIG. 3 is a schematic diagram of a heat dissipation laminated structure film layer according to an embodiment of the present application. In order to further improve the heat dissipation performance of the stack module without reducing a support effect for the first heat dissipation layer and the second heat dissipation layer, in embodiments of the present application, the support layer 106 is provided as a segmented structure.

Specifically, the support layer 106 comprises a plurality of sub-support layers. Preferably, the support layer 106 comprises a first sub-support layer 1061, a second sub-support layer 1062, and a third sub-support layer 1063. The first sub-support layer 1061, the second sub-support layer 1062, and the third sub-support layer 1063 are sequentially disposed adjacent to each other, and receiving chambers 301 is disposed between the first sub-support layer 1061 and the second sub-support layer 1062, and between the second sub-support layer 1062 and the third sub-support layer 1063. After the first heat dissipation layer 104 absorbs heat inside the device, it may dissipate the heat through the receiving chamber 301.

Further, widths of the receiving chambers 301 between two adjacent sub-support layers may be set to be different, and a width of each sub-support layer may be set to be different. Preferably, a width of the second sub-support layer 1062 is greater than the widths of the sub-support layers on both sides at an intermediate position of the bonding region of the bonding section 22, that is, the width of the second sub-support layer 1062 is greater than widths of the first sub-support layer 1061 and the third sub-support layer 1063. A width of the receiving chamber 301 away from the bending section is greater than a width of the receiving chamber 301 close to the bending section. In this way, heat absorbed by the first heat dissipation layer 104 and the second heat dissipation layer 105 can be dissipated through the receiving chamber 301, thereby effectively ensuring the heat dissipation effect of the display panel.

Figure 4:
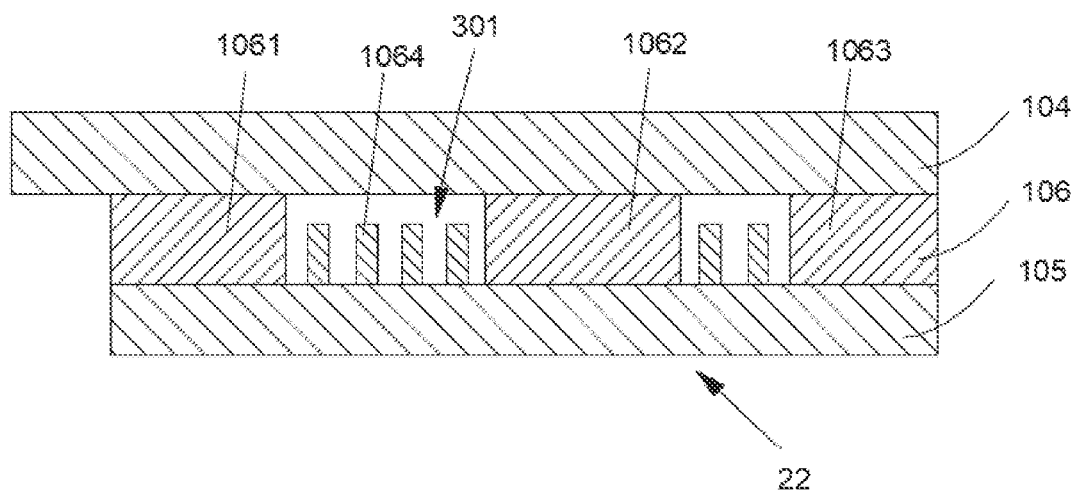
FIG. 4 is a schematic diagram of another heat dissipation laminated structure according to an embodiment of the present application.

As shown in FIG. 4, FIG. 4 is a schematic diagram of a film layer of another heat dissipation structure according to an embodiment of the present application. In combination with the structure shown in FIGS. 1-3, in embodiments of the present application, an auxiliary support column 1064 is further disposed in the receiving chamber 301. Specifically, a plurality of auxiliary support columns 1064 with same or different structures may be disposed in each receiving chamber 301. Meanwhile, a distance between two adjacent support columns 1064 may be same or different in a same receiving chamber. Preferably, in embodiments of the present application, a height of the auxiliary support column 1064 is not greater than a height of the receiving chamber 301. When the height of the auxiliary support column 1064 is same as a height of the chamber of the receiving chamber 301, the support column is in contact with the first heat dissipation layer and the second heat dissipation layer. In embodiments of the present application, a plurality of auxiliary support column structures are disposed in the receiving chamber to enhance the support effect of the support layer. In embodiments of the present application, the auxiliary support column can be made of a metal material or a material with certain rigidity. Preferably, the material of the auxiliary support column may be same as the material of the support layer. A number and height of auxiliary support columns can be specifically set according to an actual product, and details are not described here.

Figure 5:
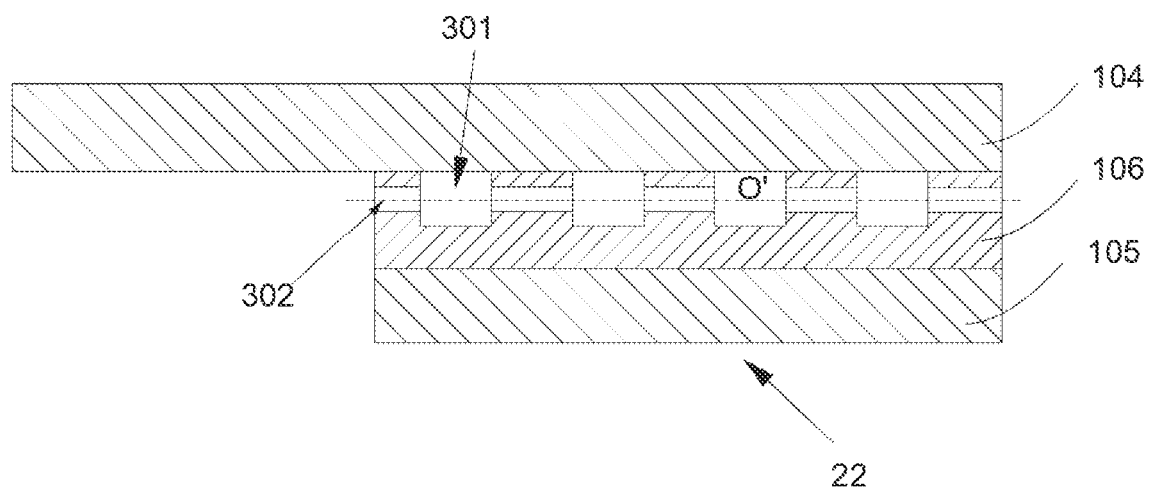
FIG. 5 is a schematic diagram of yet another heat dissipation laminated structure according to an embodiment of the present application.

In embodiments of the present application, as shown in FIG. 5, FIG. 5 is a schematic diagram of another heat dissipation laminated structure according to an embodiment of the present application. Specifically, the support layer 106 is disposed with a plurality of receiving chambers 301. Since the first heat dissipation layer 104 absorbs a larger amount of heat, the plurality of receiving chambers 301 are disposed at intervals on one side close to the first heat dissipation layer 104. When arranging the above receiving chamber 301, a thickness of the receiving chamber 301 should not exceed half of a thickness of the supporting layer 106, thereby ensuring that the supporting layer 106 has a better supporting effect.

Specifically, one side of the receiving chamber 301 is open, and a plurality of receiving chamber 301 mutually spaced are formed by openings on an upper surface of the supporting layer 106. Preferably, size of the opening in each receiving chamber 301 may be set according to an actual situation of a product. In embodiments of the present application, size of the opening, depth of the opening and spacing distance between two adjacent receiving chambers 301 are same. Thus, the support layer 106 has a better symmetry.

Further, a vent hole 302 is further disposed in the support layer 106, and a direction of the vent hole 302 is from the bending section to the straight section. In the direction of a same row or column, the vent hole 302 penetrates each receiving chamber 301 in this row or the corresponding column. An opening diameter of the vent hole 302 is less than the height of the receiving chamber 301.

When the first heat dissipation layer absorbs a larger amount of heat, on one hand, the heat may be directly transferred to the support layer 106 and discharged to the environment through the support layer 106; and on another hand, the heat may directly pass through the receiving chamber 301 and be dissipated to the outside environment under guidance of the vent hole 302, so as to effectively control temperature inside the display panel, thus avoiding overheating of the display panel during long-time operation and ensuring stable performance of the display panel.

Further, in embodiments of the present application, when arranging the above vent hole 302, a diameter of the vent hole 302 is far less than the height of the chamber of the receiving chamber 301. Meanwhile, a height of the vent hole 302 may be set close to a central axis O' of the receiving chamber 301. Preferably, the vent hole 302 is disposed on the symmetry central axis O' of the receiving chamber 301. In this way, a problem of poor support of the support layer 106 caused by a large force after the force acting on the support layer 106 is avoided, thereby ensuring the reliability of the display panel. In embodiments of the present application, the number of the vent holes 302 may be specifically disposed according to the thickness of the support layer 106, so as to further improve the heat dissipation effect of the support layer to the heat dissipation layer.

Meanwhile, in embodiments of the present application, a width of the support layer 106 is not less than a width of the corresponding second heat dissipation layer 105. Preferably, the width of the support layer 106 is same as the width of the second heat dissipation layer 105. In this way, the second heat dissipation layer 105 can be effectively bonded to the support layer 106, and the bonding effect of the display panel can be ensured.

Further, in embodiments of the present application, when arranging a structure of the above heat dissipation stack module, preferably, a thickness of the adhesive layer 107 is smaller than thicknesses of the first heat dissipation layer 104, the support layer 106, and the second heat dissipation layer 105; and the thickness of the first heat dissipation layer 104 is greater than the thickness of the second heat dissipation layer 105. Meanwhile, the thickness of the support layer 106 is greater than the thickness of the second heat dissipation layer 105. In embodiments of the present application, the thickness of the first heat dissipation layer 104 is made smaller than the thickness of the second heat dissipation layer 105, and meanwhile, a rigidity of the support layer 106 is greater than rigidities of the second heat dissipation layer and the first heat dissipation layer.

Preferably, in embodiments of the present application, the first heat dissipation layer 104, the support layer 106, and the second heat dissipation layer 105 may have a thickness ranging from 30 μm to 150 μm, and a thickness relationship among the film layers can be disposed according to the above-described limitation, so as to ensure the heat dissipation performance of the display panel.

In embodiments of the present application, since the heat dissipating layer with good heat dissipation performance is in direct contact with the flexible screen and other components, when more heat is generated in the components, the heat can be effectively transferred out. In the above embodiments, metal heat dissipation layer material with good heat dissipation performance is used for description. Preferably, the first heat dissipation layer and the second heat dissipation layer may also be composed of other metal materials with good heat dissipation performance or non-metal materials, such as graphite materials, etc. Other heat dissipation materials are not described in detail here, and the purpose of which is to directly bond the heat dissipation layer to the flexible screen, so as to improve the heat dissipation effect of the display panel.

Preferably, the display panel in embodiments of the present application further comprises a buffer layer 108, the buffer layer 108 is disposed on one side of the second heat dissipation layer 105 away from the flexible screen 100, one end of the buffer layer 108 is flush with one end of the second heat dissipation layer 105, and another end of the buffer layer 108 extends to one end of the support layer 106. A certain space distance is reserved between the support layer 106 and the buffer layer 108, and the distance between the support layer 106 and the buffer layer 108 can be adjusted to adapt to different film structures.

In embodiments of the present application, the buffer layer 108 may be a buffer foam material, so that the buffer layer 108 has a better buffer effect.

Figure 6:
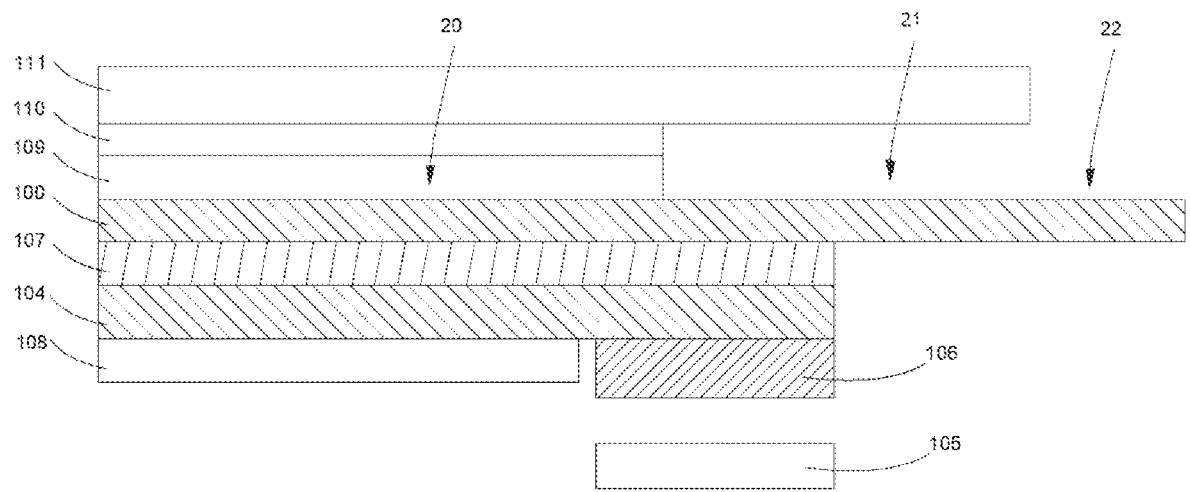
FIG. 6 is a schematic diagram in a flattened state provided in an embodiment of the present application.

Further, as shown in FIG. 6, FIG. 6 is a schematic diagram in a flattened state provided in an embodiment of the present application. When the display panel in embodiments is disposed with the above-mentioned heat dissipation stack module, it can be bonded in modules or integrally. Specifically, in a flattened state of the flexible screen 100, the first heat dissipation layer 104 is bonded to the adhesive layer 107, then the support layer 106 is bonded to the first heat dissipation layer 104, finally the second heat dissipation layer 105 is bonded to the support layer 106, and finally the bonding section 22 of the flexible screen 100 is bonded to one side of the second heat dissipation layer 105. In the above manufacture process, each heat dissipating layer is bonded independently to adapt to different manufacture conditions.

Preferably, in embodiments of the present application, the heat dissipation stack module can also be integrally bonded. Specifically, the first heat dissipation layer 104, the support layer 106, and the second heat dissipation layer 105 are bonded as a whole, then the whole film layer is bonded to one side of the adhesive layer 107, and finally, the flexible screen is bonded to one side of the second heat dissipation layer 105, thereby effectively simplifying the manufacture process of the display panel.

As shown in FIG. 2, in embodiments of the present application, the display panel further comprises a protection layer 112. The protective layer 112 is disposed in the bending section 21 of the flexible screen 100, and the protective layer 112 is bonded to a surface of the bending section 21. When the flexible screen 100 is bent, the protective layer 112 can better absorb stress formed in the bending position during a bending process, thus avoiding a problem that the flexible screen corresponding to the bending section 21 is broken, and further improving the reliability of the display panel.

Further, the display panel in embodiments of the present application further comprises a polarizer layer 109, an optical adhesive layer 110, and a cover plate 111. The polarizer layer 109 is disposed on a light emitting side of the flexible screen 100, the optical adhesive layer 110 is disposed on the polarizer layer 109, and the cover plate 111 is disposed on the optical adhesive layer 110. The polarizer layer 109 and the cover plate 111 are bonded by the optical adhesive layer 110. Preferably, other functional film layer structures may be disposed between the polarizer layer 109 and the flexible screen 100 or between the polarizer layer 109 and the cover plate 111 to further improve the display effect of the display panel.

In embodiments of the present application, a length of the cover plate 111 exceeds the display area corresponding to the straight section 20 of the flexible screen 100, so as to ensure a better protection effect on the display area.

Further, the display panel in embodiments of the present application further comprises a driver chip 113 and a flexible circuit board 114. In the display panel, the driver chip 113 is fixed to the flexible circuit board 114, and the flexible circuit board 114 is bound on the bonding area of the display panel. After bending, the driver chip 113 is placed on the back side of the display panel. Specifically, the driver chip 113 and the flexible circuit board 114 are disposed in the bonding section 22 of the flexible screen 100, and the driver chip 113 and the flexible circuit board 114 are correspondingly disposed on one side of the bonding section 22 away from the second heat dissipation layer 105. The driver chip 113 provides a drive signal to the flexible screen and the flexible circuit board to drive the display panel to work normally.

When the driver chip 113 works normally, heat formed on the driver chip 113 is directly transferred upward to the second heat dissipating layer 105, and the second heat dissipation layer 105 in embodiments of the present application is a metal heat dissipation layer, which has good heat absorption performance, and can absorb the transferred heat and discharge it to the environment, thereby effectively ensuring stability of an internal temperature of the display panel.

Figure 7:
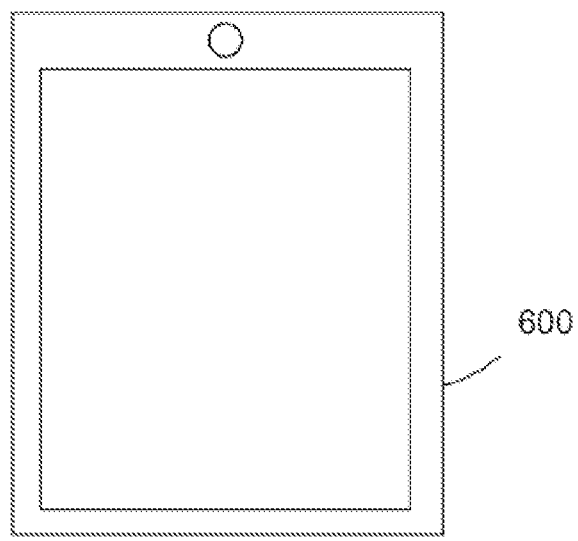
FIG. 7 is a schematic planar structure diagram of a display device according to an embodiment of the present application.

Further, an embodiment of the present application further provides a display device, as shown in FIG. 7, FIG. 7 is a schematic planar structure diagram of a display device provided in an embodiment of the present application. The display device 600 comprises a display panel provided in embodiments of the present application, the heat dissipation module in the display panel has a laminated structure, and the heat dissipation layer is made of a metal material. The heat dissipation layer can better absorb the heat generated by the device in the panel and discharge it.

The display device 600 provided in embodiments of the present application may be applied to any product or component with better display performance such as a liquid crystal panel, an electronic paper, an organic light-emitting diode, a mobile phone, a tablet computer, or a display. Therefore, the display device with the above display panel also has the above technical effects, and details are not described here.

The display panel and display device provided by embodiments of the present application are described in detail above. The principles and embodiments of this application are described by using specific examples herein. In the present application, specific embodiments are applied to illustrate the principle and implementation of the present application, and the above embodiments are only used to help to understand the technical solutions and core ideas of the present application. Those skilled in the art shall understand that it is possible to modify the technical solutions described in the foregoing embodiments, or to equivalently substitute some of the technical features thereof. These modifications or substitutions do not separate the nature of the corresponding technical solutions from the technical solutions of the embodiments of the present application.

What is claimed is:

1. A display panel, comprising:
    a flexible screen, the flexible screen comprising a straight section, a bending section, and a bonding section that are sequentially connected;
    an adhesive layer, the adhesive layer disposed on a backlight side of the flexible screen, and the adhesive layer correspondingly disposed in the straight section of the flexible screen;
    a first heat dissipation layer, the first heat dissipation layer disposed on one side of the adhesive layer away from the flexible screen;
    a support layer, the support layer disposed on one side of the first heat dissipation layer away from the adhesive layer; and
    a second heat dissipation layer, wherein one side of the second heat dissipation layer is bonded to the support layer, and another side of the second heat dissipation layer is electrically connected to a back side of the flexible screen corresponding to the bonding section;
    wherein the support layer and the second heat dissipation layer are disposed on one side close to the bending section, both the first heat dissipation layer and the second heat dissipation layer are disposed as metal heat dissipation layers, metal particles are disposed in the metal heat dissipation layers, and a gap is formed between adjacent metal particles.

2. The display panel according to claim 1, wherein materials of the first heat dissipation layer and the second heat dissipation layer comprise any one of copper, copper foil, silver, aluminum, or an alloy thereof.

3. The display panel according to claim 2, wherein a heat dissipation property corresponding to a material of the first heat dissipation layer is greater than a heat dissipation property corresponding to a material of the second heat dissipation layer.

4. The display panel according to claim 1, wherein a material of the support layer comprises a metal material or a composite conductive material.

5. The display panel according to claim 4, wherein the composite conductive material comprises any one of a composite material of a polymer and a graphite, a graphene composite material, and a carbon nanocomposite material.

6. The display panel according to claim 1, wherein the first heat dissipation layer, the support layer, and the second heat dissipation layer are flush with each other on one side close to the bending section.

7. A display panel, comprising:
    a flexible screen, the flexible screen comprising a straight section, a bending section and a bonding section that are sequentially connected;
    an adhesive layer, the adhesive layer disposed on a backlight side of the flexible screen, and the adhesive layer is correspondingly disposed in the straight section of the flexible screen;
    a first heat dissipation layer, the first heat dissipation layer disposed on one side of the adhesive layer away from the flexible screen;
    a support layer, the support layer disposed on one side of the first heat dissipation layer away from the adhesive layer; and
    a second heat dissipation layer, wherein one side of the second heat dissipation layer is bonded to the support layer, and another side of the second heat dissipation layer is electrically connected to a back side of the flexible screen corresponding to the bonding section;
    wherein the support layer and the second heat dissipation layer are disposed on one side close to the bending section, and both the first heat dissipation layer and the second heat dissipation layer are disposed as metal heat dissipation layers.

8. The display panel according to claim 7, wherein materials of the first heat dissipation layer and the second heat dissipation layer comprise any one of copper, copper foil, silver, aluminum, or an alloy thereof.

9. The display panel according to claim 8, wherein a heat dissipation property corresponding to a material of the first heat dissipation layer is greater than a heat dissipation property corresponding to a material of the second heat dissipation layer.

10. The display panel according to claim 7, wherein a material of the support layer comprises a metal material or a composite conductive material.

11. The display panel according to claim 10, wherein the composite conductive material comprises any one of a composite material of a polymer and a graphite, a graphene composite, and a carbon nanocomposite.

12. The display panel according to claim 7, wherein the first heat dissipation layer, the support layer, and the second heat dissipation layer are flush with each other on one side close to the bending section.

13. The display panel according to claim 12, wherein a projected area of the first heat dissipation layer on the adhesive layer is greater than projected areas of the support layer and the second heat dissipation layer on the adhesive layer.

14. The display panel according to claim 7, wherein the first heat dissipation layer and the second heat dissipation layer have a thickness ranging from 30 μm to 150 μm.

15. The display panel according to claim 7, wherein the support layer comprises at least two sub-support layers disposed at intervals, and a receiving chamber is provided between two adjacent sub-support layers.

16. The display panel according to claim 15, wherein an auxiliary support column is further disposed in the receiving chamber, and a height of the auxiliary support column is not greater than that of the receiving chamber.

17. The display panel according to claim 15, wherein the support layer further comprises a vent hole, the vent hole is disposed in the support layer, and the vent hole penetrates the receiving chamber.

18. The display panel according to claim 7, wherein the display panel further comprises a flexible protective layer, and the flexible protective layer is disposed on a corresponding flexible screen in the bending section.

19. The display device according to claim 7, wherein the display panel further comprises foam, a driver chip, and a flexible circuit board, the foam is disposed on one side of the first heat dissipation layer away from the flexible screen, the driver chip and the flexible circuit board are disposed on the flexible screen and are electrically connected to the bonding section of the flexible screen.

20. A display device, comprising:
- a display panel;
- a function layer, the function layer disposed on the display panel; and
- a cover plate, the cover plate disposed on the functional layer;

wherein the display panel comprises a flexible screen, the flexible screen comprises a straight section, a bending section, and a bonding section that are sequentially connected;
- an adhesive layer, the adhesive layer disposed on a backlight side of the flexible screen, and the adhesive layer is correspondingly disposed in the straight section of the flexible screen;
- a first heat dissipation layer, the first heat dissipation layer disposed on one side of the adhesive layer away from the flexible screen;
- a support layer, the support layer disposed on one side of the first heat dissipation layer away from the adhesive layer; and
- a second heat dissipation layer, wherein one side of the second heat dissipation layer is bonded to the support layer, and another side of the second heat dissipation layer is electrically connected to a back side of the flexible screen corresponding to the bonding section;

wherein the support layer and the second heat dissipation layer are disposed on one side close to the bending section, and both the first heat dissipation layer and the second heat dissipation layer are disposed as metal heat dissipation layers.

\* \* \* \* \*